(12) United States Patent
Zahorik et al.

(10) Patent No.: US 6,889,698 B2
(45) Date of Patent: May 10, 2005

(54) APPARATUS FOR SELECTIVE REMOVAL OF MATERIAL FROM WAFER ALIGNMENT MARKS

(75) Inventors: Russell C. Zahorik, Boise, ID (US); Guy F. Hudson, Boise, ID (US); Hugh E. Stroupe, Boise, ID (US); Todd A. Dobson, Meridian, ID (US); Brian F. Gordon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/367,224

(22) Filed: Feb. 14, 2003

(65) Prior Publication Data

US 2003/0121538 A1 Jul. 3, 2003

Related U.S. Application Data

(60) Continuation of application No. 10/154,582, filed on May 24, 2002, now Pat. No. 6,530,113, which is a continuation of application No. 09/567,631, filed on May 9, 2000, now Pat. No. 6,447,634, which is a division of application No. 08/916,997, filed on Aug. 20, 1997, now Pat. No. 6,103,636.

(51) Int. Cl.[7] .................................................. B08B 3/02
(52) U.S. Cl. ....................... 134/184; 134/198; 134/902; 15/321
(58) Field of Search ................................ 134/184–198, 134/902; 15/302, 320, 321

(56) References Cited

U.S. PATENT DOCUMENTS

| | | | |
|---|---|---|---|
| 2,568,803 A | 9/1951 | Guenst | |
| 3,574,239 A | 4/1971 | Sollerud | |
| 3,705,437 A | 12/1972 | Rukavina, Jr. et al. | |
| 3,747,155 A | 7/1973 | Koellisch | |
| 3,949,771 A | 4/1976 | Dodge et al. | |
| 4,168,562 A | 9/1979 | Maasberg | |
| 4,341,568 A | 7/1982 | Christensen | |
| 4,611,553 A | 9/1986 | Iwata et al. | |
| 4,750,980 A | 6/1988 | Hynecek | |
| 4,872,920 A | 10/1989 | Flynn et al. | |
| 5,125,126 A | 6/1992 | Bonnant | |
| 5,158,101 A | 10/1992 | Sakka | |
| 5,185,056 A | 2/1993 | Fuentes et al. | |
| 5,223,083 A | 6/1993 | Cathey et al. | |
| 5,271,798 A | 12/1993 | Sandhu et al. | |
| 5,443,653 A | 8/1995 | Riley | |
| 5,503,594 A | 4/1996 | Karubian et al. | |
| 5,555,902 A | 9/1996 | Menon | |
| 5,561,884 A | 10/1996 | Nijland et al. | |
| 5,576,831 A | 11/1996 | Nikoonahad et al. | |
| 5,576,833 A | 11/1996 | Miyoshi et al. | |
| 5,603,775 A | 2/1997 | Sjoberg | |
| 5,607,818 A | 3/1997 | Abram et al. | |
| 5,646,452 A | 7/1997 | Narimatsu | |
| 5,783,044 A | 7/1998 | Schneider et al. | |
| 6,103,636 A | 8/2000 | Zahorik et al. | |
| 6,243,914 B1 | 6/2001 | Studebaker | |
| 6,269,517 B1 | 8/2001 | Dornier | |
| 6,329,301 B1 | 12/2001 | Zahorik et al. | |
| 6,447,634 B1 * | 9/2002 | Zahorik et al. | 156/345.1 |
| 6,530,113 B1 * | 3/2003 | Zahorik et al. | 15/302 |

FOREIGN PATENT DOCUMENTS

JP         09-027482         1/1997

* cited by examiner

*Primary Examiner*—Frankie L. Stinson
(74) *Attorney, Agent, or Firm*—TraskBritt

(57) ABSTRACT

A process and apparatus for locally removing any material, such as a refractory metal, in particular tungsten, from any desired area of a wafer, such as an alignment mark area of a silicon wafer in process during the formation of integrated circuits thereon.

17 Claims, 5 Drawing Sheets

APPARATUS FOR SELECTIVE REMOVAL OF MATERIAL FROM WAFER ALIGNMENT MARKS

CROSS-REFERENCE TO RELATED APPLICATIONS

This application is a continuation of application Ser. No. 10/154,582, filed May 24, 2002, now U.S. Pat. No. 6,530,113 B2, issued Mar. 11, 2003, which is a continuation of application Ser. No. 09/567,631, filed May 9, 2000, now U.S. Pat. No. 6,447,634 B1, issued Sep. 10, 2002, which is a divisional of application Ser. No. 08/916,997, filed Aug. 20, 1997, now U.S. Pat. No. 6,103,636, issued Aug. 15, 2000.

BACKGROUND OF THE INVENTION

Field of the Invention: This invention relates to improved semiconductor processing technology. More specifically, the present invention relates to an improved process and apparatus for locally removing any desired material from predetermined areas of a silicon wafer in process during the formation of integrated circuits thereon, such as the removal of material from the wafer alignment mark areas of a silicon wafer.

State of the Art: The fabrication of integrated circuits on silicon wafers utilizes many differing processes and materials. For instance, photolithographic techniques are used to pattern the various gates on the silicon chip. As sophisticated pattern definition technologies have been used, the geometries of the integrated circuit components have shrunk from the 6 micron size of the late 1970's to the submicron technologies of the late 1980's to the deep submicron regions of the 1990's. Therefore, it has become increasingly important to carefully align the wafer during semiconductor device manufacturing processes. Also, as the size of the features of the integrated circuits has become increasingly smaller and the spacing of the semiconductor devices has decreased on the wafer, out of necessity, the size of any predetermined area of the wafer containing any feature or circuit component on the wafer has decreased. For instance, the alignment marks on the wafer used to align the wafer during manufacturing processes and the area surrounding the alignment marks on the wafer have become increasingly smaller.

Due to various constraints in semiconductor device manufacturing processes, it is critical that predetermined areas of the wafer be free of material contamination during the process. As an example, the alignment marks on the wafer should be kept free of contaminants so that the process equipment can easily locate and use such alignment marks. In various semiconductor manufacturing processes, the alignment marks can easily become contaminated or covered with various process materials. In such instances, it is necessary to clean the alignment marks on the wafer before any subsequent processing occurs to ensure proper alignment of the wafer on the process equipment.

As one example of such process problems, after the application of a photoresist material used in a circuit forming process and the subsequent etching of the wafer to form the desired circuit or portion thereof, the alignment marks on the wafer may be covered with photoresist material which must be removed prior to the continued processing of the wafer.

As another example, a chemical mechanical planarization process is the preferred method of planarizing various films and coatings on wafers. However, a chemical mechanical planarization process does not necessarily uniformly remove material from the wafer surface due to either dishing of the polishing pad caused by surface irregularities on the wafer and/or the non-uniform application of the polishing slurry over the wafer surface. Such problems occur, particularly, when using a chemical mechanical planarization process to remove refractory metal films and the like. Since the refractory metal film is not of uniform thickness, the refractory metal film may not be removed in the areas of the wafer where alignment marks are present or other predetermined areas of the wafer. Furthermore, the alignment marks, or other predetermined areas, on the wafer may also be covered with slurry material used in the chemical mechanical planarization process or have residual refractory metal film remain which has not been removed during the chemical mechanical planarization process thereon, thereby obscuring the alignment marks. Therefore, it is desirable to have a method and apparatus for cleaning predetermined areas of the wafer, such as the alignment marks of wafers, after chemical mechanical planarization processes thereon.

As an example of such wafer process problems discussed above, the fabrication of multi-level interconnections in integrated circuits has been facilitated through the use of tungsten, a refractory metal. However, tungsten is difficult to etch selectively because the surface of most tungsten films deposited using chemical vapor deposition techniques is rough and because tungsten and silicon dioxide form volatile fluoride compounds. Due to such problems, it is difficult to selectively etch tungsten to remove the unwanted tungsten that remains on the low areas of the wafer surface, such as those areas where semiconductor devices are being formed, or in predetermined areas of the wafer, such as those areas of the wafer surface where alignment marks exist.

Since a tungsten film covers the surface of semiconductor devices being formed on the wafer surface, the tungsten film must be etched back selectively so that the tungsten film only remains in the vias or contact holes to eliminate the tungsten film in the low areas of the wafer surface. Several methods use either a photoresist or a polyimide sacrificial film to planarize the tungsten film. Using these methods requires the sacrificial film to be highly planarized, followed by an over-etch to clear all of the tungsten film from the low areas of the wafer surface that are present after the planarization of the wafer surface. Since tungsten etching is difficult to control to produce a uniform surface on the wafer, over-etching is often required to insure tungsten removal. However, over-etching can result in recessed tungsten plugs which interconnect the integrated circuitry being formed on the wafer in process, particularly when the wafer is not of uniform thickness. Additionally, over-etching may not remove the tungsten from all low areas of the wafer surface, such as those areas where the alignment marks of the wafer are present or other predetermined areas of the wafer.

In a prior art process, described in U.S. Pat. No. 5,271,798, a method for the selective etching of the alignment mark areas of the wafer is set forth to selectively etch the alignment mark areas of the wafer using a wet etching process which can be controlled and isolated to a specific area of the wafer. In the prior art process, tungsten is selectively etched locally from the alignment marks on the wafer either before or after the chemical mechanical planarization process. The wafers are flat aligned and a tungsten etch solution is introduced through an enclosed etchant dispensing apparatus onto low lying areas of the wafer surface which result from the alignment marks used for aligning various photolithography mask steps. Since the alignment marks are normally a few hundred microns in size and if a large amount of unused silicon area exists around the alignment marks, the alignment area constraints regarding an enclosed etchant dispensing apparatus and wafer are not too severe. Also, when a large amount of unused silicon area exists around the alignment marks, the tungsten plugs in the semiconductor device being formed on the wafer can be easily protected from the wet etch. Either during or after the etch, the etching products are removed and the wafers are cleaned by being rinsed in distilled water.

In U.S. Pat. No. 5,271,798, a method and apparatus is illustrated for the cleaning of alignment marks on a wafer. The apparatus illustrated uses a cylindrical containment apparatus having a seal on the bottom thereof to sealingly engage the area surrounding the alignment mark on a wafer. An etchant is dispensed through the containment apparatus onto the alignment mark on the wafer to etch contaminants therefrom with the etchant being removed from the alignment mark area by a vacuum. Such a prior art method and apparatus require a physical contact seal between the containment apparatus and the wafer area surrounding the alignment mark which may cause damage to the surface of the wafer or surrounding semiconductor devices being formed on the wafer.

However, as discussed previously, with the increasing density of semiconductor devices formed on the wafer surface, the area available for the placement of semiconductor devices and the surrounding predetermined areas of the wafer which must be kept clean during wafer processing has decreased. For example, the alignment marks and the unused silicon area surrounding the alignment marks have decreased for use of the etching equipment during the removal of material from the alignment marks of the wafer.

Therefore, a need exists for an improved method and apparatus for the reliable etching of any material, such as a photoresist material, chemical mechanical planarization process materials, a refractory metal, etc., from predetermined areas of the wafer and the surrounding areas, such as the alignment marks on wafers, without damage to the surrounding wafer area or the circuitry components on the wafer.

BRIEF SUMMARY OF THE INVENTION

The present invention is directed to an improved process and apparatus for locally removing material from predetermined areas of the wafer, such as the wafer alignment mark areas of a silicon wafer in process during the formation of integrated circuits thereon. A process and apparatus of the present invention locally removes material from predetermined areas of the wafer, such as the wafer alignment mark areas of a silicon wafer, in process during the formation of integrated circuits thereon without contacting the area surrounding the predetermined area of the wafer, such as the alignment mark of the wafer, while maintaining the etching material within the predetermined area, such as the alignment mark area, to prevent damage to the surrounding semiconductor circuits. The process comprises the steps of aligning the predetermined area, such as the alignment marks, on the wafer to an etchant dispensing apparatus, positioning a portion of the etchant dispensing apparatus adjacent the surface of the wafer at the predetermined area, dispensing at least one etchant agent onto the predetermined area, such as the alignment mark, and removing any etching agent or cleaner or rinse material from the wafer. The apparatus for the cleaning of an area of a semiconductor wafer using a material comprising a tube having a bore therethrough and exterior wall, the tube supplying a material to said area of the wafer and an annular member having an interior wall surrounding the tube, the annular member having a thin annular edge thereon for positioning adjacent a portion of the predetermined area of the wafer, such as the alignment mark area of the wafer, during the cleaning thereof, the annular member forming an annular space between the tube and the interior wall of the annular member.

DETAILED DESCRIPTION OF THE INVENTION

Figure 1:
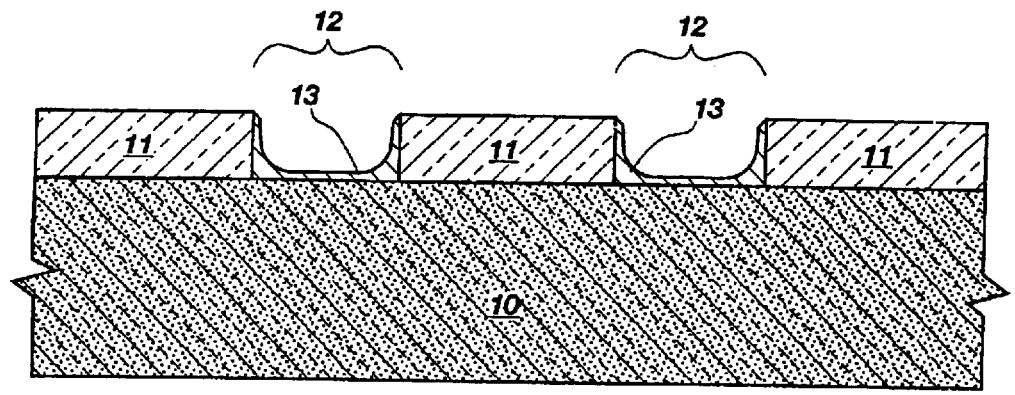
FIG. 1 is a cross-sectional view of a portion of a wafer in process.

Referring to drawing FIG. 1, a silicon wafer 10 has an overlying layer 11 of borophosphosilicate glass (BPSG) in which patterns for circuits have been etched exposing silicon wafer 10 at alignment marks 12 on the wafer 10, a predetermined area of the wafer. A material has been formed over the wafer surface and the surface planarized, typically using a chemical mechanical planarization process leaving residue 13 at the alignment marks 12, a predetermined area of the wafer, on the wafer 10. Typically, a refractory metal, tungsten will have been deposited by chemical vapor deposition over the wafer surface and the surface planarized using a chemical mechanical planarization process leaving residue 13 at the alignment marks 12 on the wafer 10 or other predetermined areas of the wafer. The residue 13 may include the chemical mechanical planarization process slurry material, a refractory metal residue, a photoresist residue, a dielectric material residue, a polysilicon material residue, etc.; i.e., for example, any residue from a semiconductor manufacturing process may be present in the alignment marks 12 on the wafer 10 to be removed therefrom or from any desired predetermined area of the wafer.

Figure 2:
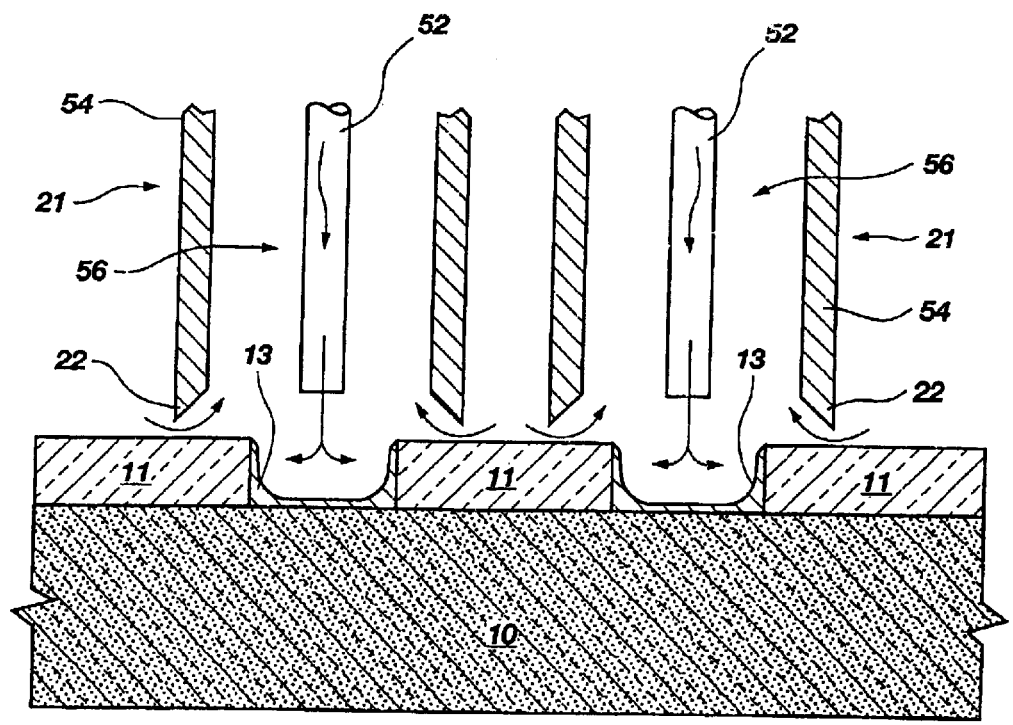
FIG. 2 is a cross-sectional view of a portion of a wafer in process with a portion of the apparatus of the present invention.

Referring to drawing FIG. 2, the wafer 10 is mounted in a substantially flat alignment (horizontal, perpendicular alignment) prior to the local dispersion of a wet etching agent to remove residue 13. The wet etching agent may comprise well known etching agents, such as liquid, liquid vapor, gases, etc., examples of such including ammonia, hydrogen fluoride, nitric acid, hydrogen peroxide, ammonium fluoride, etc. The etchant may be heated, if desired, by any suitable source, such as ultrasonic energy, laser heating, etc. The wafer surface overlying layer 11 must be positioned in relation to apparatus 21 such that lower thin annular edge 22, an annular type knife edge of the apparatus 21, is positioned adjacent layer 11, but not in contact with layer 11, to provide a "virtual" seal or vacuum therewith. An etching agent is introduced through a tubular member 52, a needle-like member of etchant dispensing apparatus 21, (also referred to as "etching apparatus" or "cleaning apparatus" 21) onto the alignment marks 12 on the wafer 10 to remove the residue 13. Since the alignment mark 12 is a few hundred microns in size and little unused area exists on the wafer 10 surrounding the mark 12, the constraints regarding the size and use of the etching apparatus are severe in order to ensure that any semiconductor circuit components in the electronic circuitry located on the wafer surrounding an alignment mark 12 are protected from the etching process. The etching apparatus 21 is an enclosed apparatus with the thin annular edge 22 thereof creating a "virtual" seal or vacuum with the underlying glass (BPSG) layer 11 by a suction being applied through annular space 56 formed between the interior annular wall of annular member 54 and the exterior wall of tubular member 52 of the etching apparatus 21. Sufficient suction is applied in the annular space 56 so that the pressure of the existing atmosphere surrounding the exterior of the thin annular edge 22 is greater than the pressure in the annular space 56 with the existing atmosphere surrounding the thin annular edge 22 being drawn into the annular space 56 between the tubular member 52 and annular member 54, thereby preventing any leakage of etchant from the annular space 56. The thin annular edge 22 of the etching apparatus 21 does not contact the surface of the layer 11, thereby preventing any damage thereto. The surrounding atmosphere of the annular member 54 flows into the gap formed between the lower edge of thin annular edge 22 and the surface of layer 11 (illustrated by the arrows entering into annular space 56 in drawing FIG. 2) creating the "virtual" seal or vacuum between the etching apparatus 21 and the layer 11, thereby preventing any etchant material being used from flowing from the annular space 56 onto the surrounding area of layer 11 of the exterior to annular member 54. The thin annular edge 22 is located as close as possible to the surface of the layer 11 on the wafer 10 without being in contact therewith.

Figure 2A:
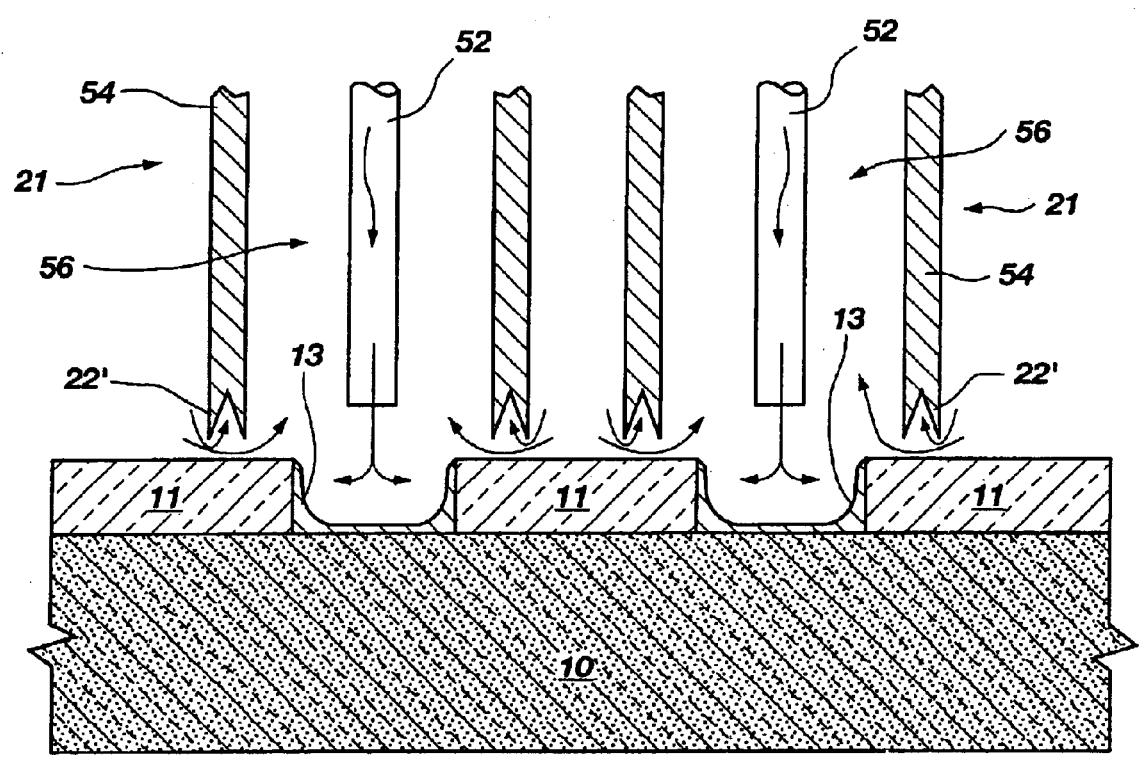
FIG. 2A is a cross-sectional view of a portion of a wafer in process with a portion of the apparatus of the present invention illustrated having a modified thin annular edge thereon.

Referring to drawing FIG. 2A, if desired, more than one thin annular edge 22 may be used on the end of annular member 54 to create a labyrinth type "virtual" seal to more effectively prevent any fluid flow from the gap between the end of the annular member 54 and the surface of the layer 11. Such a labyrinth type thin annular edge 22' is illustrated in drawing FIG. 2A as having two thin annular edges 22' formed on the bottom of the annular member 54.

In both the thin annular edge 22 and the labyrinth type thin annular edge 22', neither contacts the surface of the layer 11 to prevent the flow of etchant from the annular space 56 onto the surface of the layer 11 exterior to the annular member 54. But rather, the suction or vacuum applied to the annular space 56 draws the atmosphere surrounding the exterior of the annular member 54 into the annular space 56, thereby preventing any substantial leakage of any material in the annular space 56 to the exterior of the annular member 54. Additionally, it should be understood that the annular space 56 refers to any shape annular area formed between any two geometrically shaped members. That is, the tubular member 52 may have any desired cross-sectional geometric shape, such as cylindrical, hexagonal, square, octagon, ellipsoid, etc., and the annular member 54 may have any desired cross-sectional geometric shape, such as cylindrical, hexagonal, square, octagon, ellipsoid, etc., and the annular area 56 formed therebetween by such shaped members will have any resulting cross-sectional configuration.

Alignment between wafer 10 and etchant dispensing apparatus 21 may be accomplished by any suitable well known aligning and maneuvering techniques for aligning the wafer 10 into position. Though it is preferred that the wafer is at a 90° angle, perpendicular to the etching apparatus 21, the orientation of the wafer 10 and etching apparatus 21 can be any desired position as long as the thin annular edge 22 or 22' of the etching apparatus 21 is located substantially adjacent, but not in contact with, the surface of the layer 11 on the wafer 10. Etching by-products are removed by suctioning or vacuuming them from the alignment mark 12 through annular space 56 formed between the interior annular wall of annular member 54 and the exterior wall of tubular member 52 of the etching apparatus 21.

Figure 3:
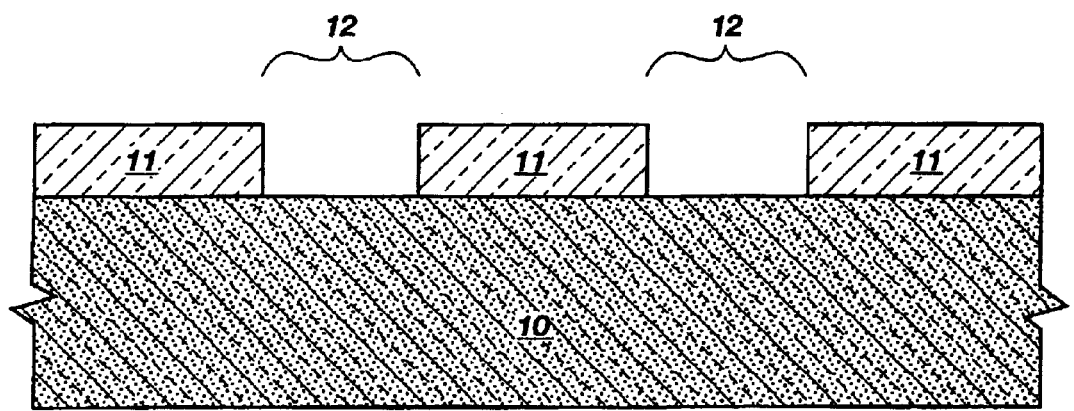
FIG. 3 is a cross-sectional view of a portion of a wafer in process having the area of the alignment marks being cleaned by the apparatus and method of the present invention.

Referring to drawing FIG. 3, residue 13 (shown in FIGS. 2 and 2A) has been removed from alignment marks 12 and the etching by-products removed by suction applied through annular space 56 of the etching apparatus 21. In addition to the removal of etching by-products from the alignment mark 12 on the wafer 10 using suction through annular space 56, the removal of the etching by-products may be performed during the step of removing etching residue 13 (in situ) from alignment mark 12 by flowing water, or any desired cleaning material or agent or rinsing material or agent, into the etchant dispensing apparatus 21 after dispensing the etching agent therethrough to have such wash the residue from the alignment mark 12. Once the etching by-product is removed, wafer 10 is then cleaned by rinsing it with deionized water or other suitable well known cleaning or rinsing agents.

Alternately, the selective etching of any material in the alignment marks 12 may be performed prior to planarization of the layer 11. Performing the selective etch prior to planarization of the layer 11 has an advantage in that the planarization removes any contaminants which may have been added on the wafer surface during selective wet etching of the alignment marks 12 (free from oxide or other particles).

Figure 4:
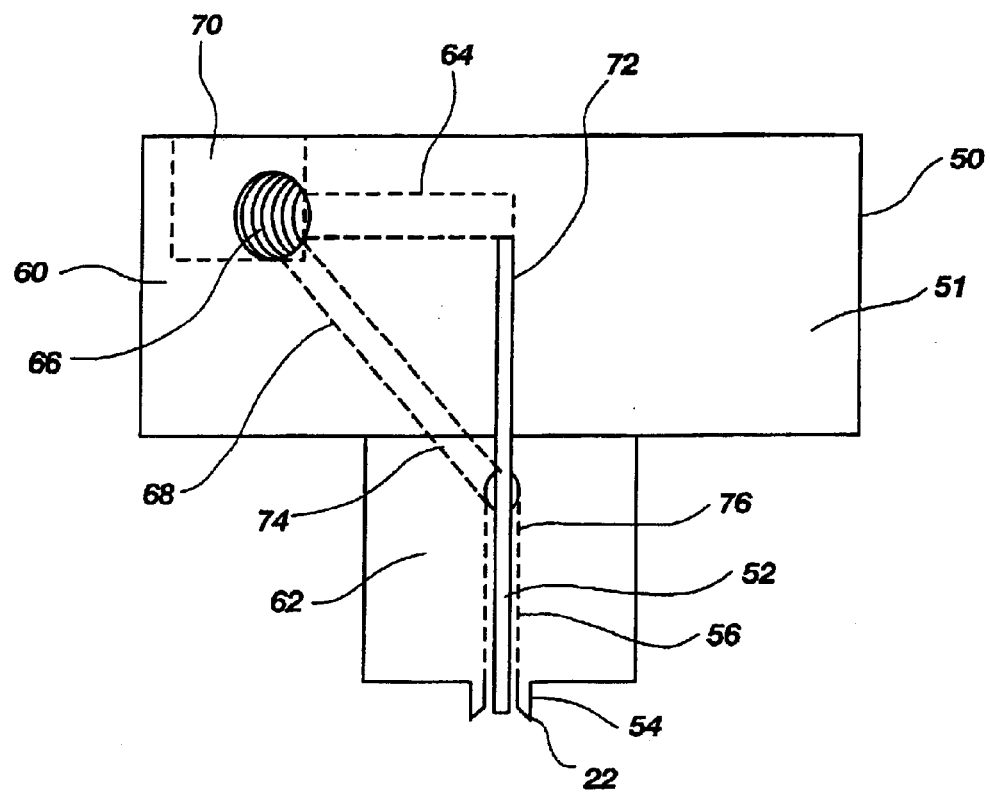
FIG. 4 is a first side view of the cleaning apparatus of the present invention.

Referring to drawing FIG. 4, the cleaning head 50 of the cleaning apparatus 21 previously described herein is shown. The cleaning head 50 comprises a cylindrical body 51 having an elongated annular member 54 on the end of the stem 62 thereof, having in turn, thin annular edge 22 located thereon for engaging the surface of the wafer 10 and tubular member 52 located therein for supplying the etching products to the alignment mark 12 of the wafer 10. The cylindrical body 51 comprises a generally cylindrical head 60 and a generally cylindrical stem 62 having elongated annular member 54 thereon. Cylindrical head 60 includes a plurality of bores 64 therein, each bore 64 having threaded aperture 66 thereon for connection to a supply line (not shown), through which etching products are supplied during the etching process, one or more bores 68, each bore 68 having an intersecting blind bore 70 connecting therewith which is connected to a suitable source of suction or vacuum, through which etching by-products are suctioned or vacuumed from the alignment marks 12 on the wafer 10 during the etching of material therefrom and a bore 72 which intersects with bores 64 and within which is contained tubular member 52 which, in turn, supplies etching products to the alignment mark 12 of the wafer 10 during the etching of material therefrom. The stem 62 of the cleaning head 50 includes the lower end 74 of bore 68 extending from cylindrical head 60, bore 76, the wall of which forms annular space 56 with respect to the exterior wall of tubular member 52, and elongated annular member 54 on the end thereof having thin annular edge 22 or 22' thereon which is located adjacent, but not in contact with, the surface of the wafer 10 or any layer 11 on the wafer 10 which has the alignment marks 12 thereon having material removed therefrom, in turn, during etching. As shown, the tubular member 52 extends throughout the bore 76 forming the annular space 56 for the removal of etching products using a suction or vacuum source during the etching of the alignment marks 12 of the wafer 10. The cleaning head 50 maybe made of any suitable material, maybe formed of any desired number of pieces for the convenience of assembly, cleaning, or replacement thereof, and may be formed in any desired geometric shape. The tubular member 52 typically comprises hypodermic needle stock tubing, such as a 24 gage, i.e., 0.022 inches in external diameter, standard hypodermic needle stock tubing, although any suitable tubing may be used, such as Teflon™ tubing, glass tubing, polymeric tubing, etc. Furthermore, the tubular member 52 may have any desired geometric cross-sectional shape, such as cylindrical, hexagonal, square, octagonal, ellipsoid, etc.

Figure 5:
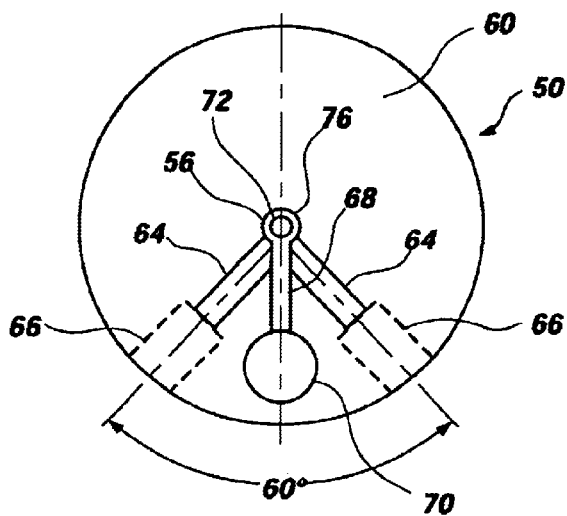
FIG. 5 is a top view of the cleaning apparatus of the present invention.

Referring to drawing FIG. 5, the cleaning head 50 is shown in a top view to illustrate the orientation of the various bores therein. As shown, the bores 64, each having threaded aperture 66 thereon, are generally spaced sixty degrees (60°) from each other and extend horizontally within the head 60 intersecting bore 72 therein. Although the bores 64 have been illustrated as located generally sixty degrees from each other, they may be located in any desired spacing. The blind bore 70 intersects bore 68 of the head 60 to allow a source of vacuum to be supplied to the cleaning apparatus 21 during the use thereof to remove the etching products from the alignment marks 12 on the wafer 10 during the etching thereof. The bore 72 extends vertically within the cylindrical head 60, having the tubular member 52 being retained therein by any suitable means, such as an interference fit, adhesively bonded, etc.

Figure 6:
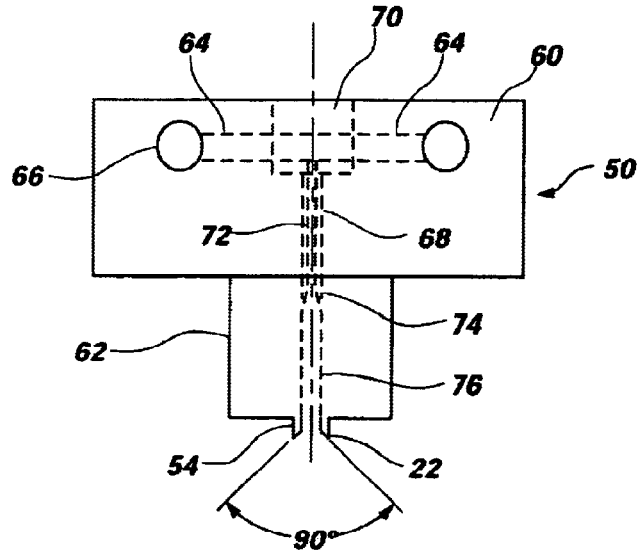
FIG. 6 is a second side view of the cleaning apparatus of the present invention.

Referring to drawing FIG. 6, the cleaning head 50 is shown in a side view to further illustrate the various bores therewithin. As illustrated, the various bores 72 and 76 are concentrically located within cylindrical head 60 and stem 62. The thin annular edge 22 on the elongated annular member 54 of the stem 62 is formed by forming a chamfered annular surface having an included angle of approximately ninety degrees (90°) therein. Although a ninety degree angle has been illustrated, the angle may be formed at any convenient angle which will provide a thin annular edge 22 on the elongated annular member 54 for being located adjacent the surface of the wafer 10 or any layer 11 located on the wafer 10 during the etching of the alignment marks 12 thereon to remove material therefrom. The thin annular edge 22 does not need to provide a fluid tight seal with respect to the wafer surface, but rather creates or forms a "virtual" seal or vacuum with respect to the wafer surface or the surface of a layer 11 on the wafer 10, because a sufficient amount of suction or vacuum is used to remove the etching products from the alignment marks 12 being etched so that the gap or space existing between the thin annular edge 22 and the layer 11 on the wafer 10, and the surrounding atmosphere, typically air, will be drawn into the annular area 56, thereby preventing any etching products from escaping from the gap or space. In this manner, in contrast to the prior art, no fluid tight seal or resilient fluid tight seal is needed on the end of the elongated annular member 54 of the stem 62, thereby eliminating all problems associated with the formation and maintenance of a fluid tight seal or resilient fluid tight seal thereon and, more importantly, any damage a fluid tight seal or resilient seal causes to the surface of the wafer 10 or any layer 11 on the wafer 10.

Figure 7:
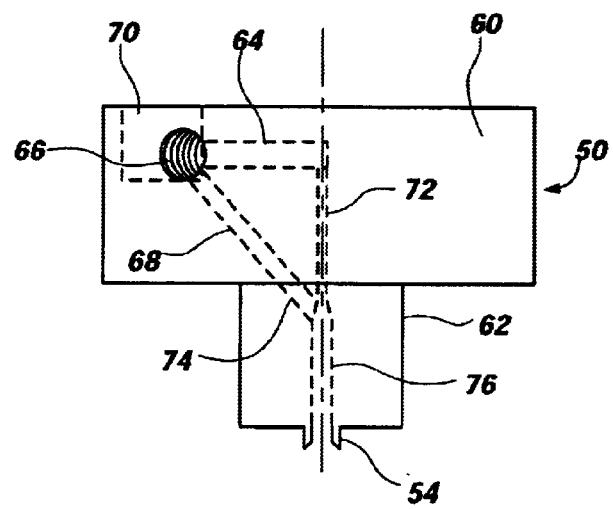
FIG. 7 is a third side view of the cleaning apparatus of the present invention.

Referring to drawing FIG. 7, the cleaning head 50 is shown in another side view to illustrate the relationship of the various bores 64, 68, 72, 76, and the lower end 74 of the bore 68 and the intersection thereof with bore 76. Again, the bores 72 and 76 are concentrically, vertically located within the cylindrical head 60 and stem 62 of the cleaning head 50.

Figure 8:
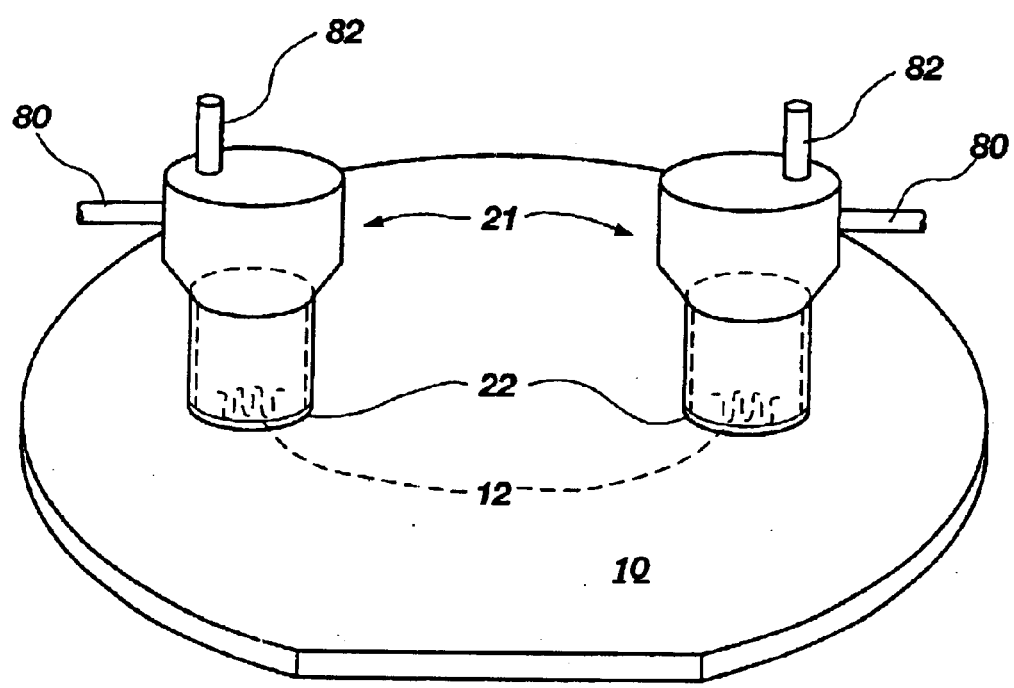
FIG. 8 is a top view illustrating a localized etchant dispensing apparatus aligned to a wafer and positioned at alignment marks that reside on the wafer.

Referring to drawing FIG. 8, the cleaning apparatus 21 is schematically illustrated during the cleaning of alignment marks 12 on a wafer 10. Each cleaning apparatus 21 has a plurality of lines 80, each line 80 being connected to threaded aperture 66 to supply etching product to the cleaning head for the cleaning of an alignment mark 12 on the wafer 10, while each cleaning head also has vacuum line 82 connected to blind bore 70 to supply suction or vacuum to the cleaning head 50 to remove etching products from the cleaning head. It should be noted that the present invention contemplates either moving the cleaning head 50 to an alignment mark 12 on a wafer 10 to perform the cleaning of the alignment mark 12 or moving the alignment mark 12 on the wafer 10 to a fixed or stationary location of the cleaning head 50. All that is necessary is to have the cleaning head 50 located above and surrounding the alignment mark 12 on a wafer 10 during operation for the cleaning of the alignment mark 12.

Although the present invention has been described with respect to the embodiment, it will be apparent that changes and modifications, such as the selective etching of any material using any desired number of etching products supplied through any desired number of lines to the cleaning apparatus, may be made without departing from the spirit and scope of the invention. Additionally, the apparatus and method may be used to selectively etch any predetermined area of a wafer to remove any material therefrom, using any desired etching products which may be heated or cooled during their use. If desired, the wafer as well as the apparatus may be heated or cooled during use.

What is claimed is:

1. Apparatus for cleaning of an area of a semiconductor wafer using a liquid material, the apparatus comprising:

a cleaning head including a tube having a bore therethrough and an exterior wall, the tube supplying the liquid material to the area of the semiconductor wafer, the tube including at least two inlets thereto for supplying the liquid material to the area of the semiconductor wafer; and an annular member connected to the cleaning head, the annular member having an interior wall surrounding the tube, the annular member having at least one thin annular edge thereon for positioning adjacent a portion of the area of the semiconductor wafer during the cleaning thereof for substantially forming a seal between the at least one thin annular edge and the semiconductor wafer, the annular member forming an annular space between the exterior wall of the tube and the interior wall of the annular member.

2. The apparatus of claim 1, wherein the tube further includes:

at least three inlets thereto for supplying the liquid material to the area of the semiconductor wafer.

3. The apparatus of claim 1, further comprising:

a source of vacuum connected to the annular space formed between the interior wall of the annular member and the exterior wall of the tube.

4. The apparatus of claim 1, wherein the tube includes a tube having any desired cross-sectional shape.

5. The apparatus of claim 1, wherein the annular member includes an annular member having any desired cross-sectional shape.

6. The apparatus of claim 1, wherein the tube is a metal tube.

7. The apparatus of claim 1, wherein the annular member includes an annular member having a plurality of thin annular edges thereon.

8. Apparatus for cleaning of an area of a semiconductor wafer using a liquid material, the apparatus comprising:

a cleaning body having a head portion having a bore therein, a stem portion having a bore therethrough, and at least two other bores therein for the liquid material, the cleaning body surrounded by an atmosphere having a static pressure, the cleaning body including:

a tube having a bore therethrough and an exterior wall, a portion of the tube retained within a portion of the bore in the head portion of the cleaning body and extending through a portion of the bore of the stem portion of the cleaning body, the tube supplying the liquid material to the area of the semiconductor wafer, the tube including at least two inlets thereto for supplying the liquid material to the area of the semiconductor wafer; and a portion of the stem portion of the cleaning body forming an annular member having an interior wall surrounding a portion of the tube, the annular member having a thin annular edge thereon for positioning adjacent a portion of the area of the semiconductor wafer during the cleaning thereof for substantially forming a seal between the thin annular edge and the semiconductor wafer, the annular member forming an annular space between the exterior wall of the tube and the interior wall of the annular member.

9. The apparatus of claim 8, wherein the tube includes:

at least three inlets thereto for supplying the liquid material to the area of the semiconductor wafer.

10. The apparatus of claim 8, further comprising:

a source of vacuum connected to the annular space formed between the interior wall of the annular member and the exterior wall of the tube.

11. The apparatus of claim 8, further comprising:

a source of reduced pressure connected to the annular space formed between the interior wall of the annular member and the exterior wall of the tube, the reduced pressure of the source being less than that of the static pressure of the atmosphere surrounding the cleaning body.

12. Apparatus for cleaning of an area of a semiconductor wafer using a liquid material, the apparatus comprising:

a cleaning body having a head portion having a bore therein, a stem portion having a bore therethrough, and at least two other bores therein for the liquid material, the stem portion connected to the head portion, the cleaning body including:

a tube having a bore therethrough and an exterior wall, a portion of the tube retained within a portion of the bore in the head portion of the cleaning body and extending through a portion of the bore of the stem portion of the cleaning body, the tube supplying the liquid material to the area of the semiconductor wafer, the tube including at least two inlets thereto for supplying the liquid material to the area of the semiconductor wafer;

a portion of the stem portion of the cleaning body forming an annular member having an interior wall surrounding a portion of the tube, the annular member having at least one thin annular edge thereon for positioning adjacent a portion of the area of the semiconductor wafer during the cleaning thereof for substantially forming a seal between the at least one thin annular edge and the semiconductor wafer, the annular member forming an annular space between the exterior wall of the tube and the interior wall of the annular member; and a source of vacuum connected to the annular space formed between the interior wall of the annular member and the exterior wall of the tube.

13. The apparatus of claim 12, wherein the head portion of the cleaning body includes a plurality of inlet bores greater than two therein connected to the bore in the head portion of the cleaning body.

14. The apparatus of claim 12, wherein the head portion of the cleaning body includes at least one other bore therein connected to the source of vacuum, the at least one other bore being connected to the annular space.

15. The apparatus of claim 12, wherein the stem portion of the cleaning body includes another bore therein connected to at least one other bore in the head portion of the cleaning body and connected to the annular space.

16. The apparatus of claim 12, wherein the tube includes a tube having any desired cross-sectional shape.

17. The apparatus of claim 14, wherein the annular space between the exterior wall of the tube and the interior wall of the annular member includes an annular space having any desired cross-sectional shape.

* * * * *

UNITED STATES PATENT AND TRADEMARK OFFICE
CERTIFICATE OF CORRECTION

PATENT NO. : 6,889,698 B2  Page 1 of 1
APPLICATION NO. : 10/367224
DATED : May 10, 2005
INVENTOR(S) : Russell C. Zahorik et al.

It is certified that error appears in the above-identified patent and that said Letters Patent is hereby corrected as shown below:

On the title page:

In ITEM (56) "References Cited,"
COLUMN 2,                              below the "FOREIGN DOCUMENTS" section insert a new section --OTHER DOCUMENTS -- then insert --Patent Abstracts of Japan for 09-027482 1/1997--

| | | |
|---|---|---|
| COLUMN 2, | LINES 3-4, | change "etchant dispensing" to --etchant-dispensing-- |
| COLUMN 3, | LINE 3, | change "etchant dispensing" to --etchant-dispensing-- |
| COLUMN 3, | LINE 59, | change "etchant dispensing" to --etchant-dispensing-- |
| COLUMN 3, | LINE 60, | change "etchant dispensing" to --etchant-dispensing-- |
| COLUMN 4, | LINE 1, | change "said" to --the-- |
| COLUMN 4, | LINES 35-36, | change "etchant dispensing" to --etchant-dispensing-- |
| COLUMN 5, | LINE 10, | change "etchant dispensing" to --etchant-dispensing-- |
| COLUMN 6, | LINE 8, | change "etchant dispensing" to --etchant-dispensing-- |
| COLUMN 6, | LINE 32, | change "etchant dispensing" to --etchant-dispensing-- |

Signed and Sealed this

Eighteenth Day of March, 2008

JON W. DUDAS
*Director of the United States Patent and Trademark Office*